(12) United States Patent
Tatoh

(10) Patent No.: US 6,220,765 B1
(45) Date of Patent: Apr. 24, 2001

(54) HERMETICALLY SEALED OPTICAL-SEMICONDUCTOR CONTAINER AND OPTICAL-SEMICONDUCTOR MODULE

(75) Inventor: Nobuyoshi Tatoh, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/137,152

(22) Filed: Aug. 20, 1998

(30) Foreign Application Priority Data

Aug. 27, 1997 (JP) .................................................. 9-230566
Aug. 27, 1997 (JP) .................................................. 9-230567

(51) Int. Cl.$^7$ ...................................................... G02B 6/36
(52) U.S. Cl. .................................. 385/94; 385/88; 385/92
(58) Field of Search .................................... 385/88, 92, 94

(56) References Cited

U.S. PATENT DOCUMENTS 5,508,740   4/1996   Miyaguchi et al. .

FOREIGN PATENT DOCUMENTS

| 0 398 597 | 11/1990 | (EP) . |
|---|---|---|
| 0 693 776 | 1/1996 | (EP) . |
| 58-025778 | 2/1983 | (JP) . |
| 62-263660 | 11/1987 | (JP) . |
| 4-154680 | 5/1992 | (JP) . |
| 4-209767 | 7/1992 | (JP) . |
| 5-067844 | 3/1993 | (JP) . |
| 6-077350 | 3/1994 | (JP) . |
| 6-082659 | 3/1994 | (JP) . |
| 6-314747 | 11/1994 | (JP) . |
| 7-99268 | 4/1995 | (JP) . |
| 8-181235 | 7/1996 | (JP) . |

*Primary Examiner*—James Phan
(74) *Attorney, Agent, or Firm*—McDermott, Will & Emery

(57) ABSTRACT

A hermetically sealed optical-semiconductor container in which an optical-semiconductor element is accommodated, comprising a frame 1 made of a metal, an insulating material or a composite material of a metal and an insulating material, a first bottom plate 11 fixed to the frame, and a second bottom plate 12 fixed to opposite surface of the first bottom plate to the frame, either of the first and second bottom plates being made of a metal and having a smaller Young's modulus than the other. For example, the first bottom plate 11 is not less than $25 \times 10^3$ kg/mm$^2$ in Young's modulus, and the second bottom plate 12 is not greater than $15 \times 10^3$ kg/mm$^2$. An optical-semiconductor element, an electronic cooling device and the like are mounted in this container, thus producing an optical-semiconductor module free from degradation of an electronic cooling element nor deviation of an optical axis occurs.

18 Claims, 8 Drawing Sheets

HERMETICALLY SEALED OPTICAL-SEMICONDUCTOR CONTAINER AND OPTICAL-SEMICONDUCTOR MODULE

BACKGROUND OF THE INVENTION

1. Field of the Invention

The present invention relates to a hermetically sealed optical-semiconductor container in which an optical-semiconductor element is accommodated, and to an optical-semiconductor module using the hermetically sealed optical-semiconductor container.

2. Description of the Prior Art

A hermetically sealed optical-semiconductor container in which an optical-semiconductor element, a driver IC or the like is accommodated is used in a semiconductor device for opto-electronics which needs to operate at high speeds in the fields such as optical communication, particularly, an optical-semiconductor module such as a light exciting source or an optical-semiconductor amplifier for an optical-fiber amplifier.

In a conventional hermetically sealed optical-semiconductor container, as shown in FIGS. 1 and 2, in general, a bottom plate 2 which is made of an Fe—Ni—Co alloy, an Fe—Ni alloy such as 42 alloy, or a composite metal material such as CuW is fixed to a frame 1 which is made of a metal such as an Fe—Ni—Co alloy. e.g., Kovar. Particularly in the hermetically sealed optical-semiconductor container which consumes a large electric power and is required to have a good heat dissipation, the bottom plate 2 made of CuW is used.

The frame 1 which constitutes the side wall portion of the hermetically sealed optical-semiconductor container is fabricated by cutting or injection molding Kovar above described, and is normally provided with ceramic-terminal portions 3 formed from a plurality of ceramic sheets having metallized portions as required, and lead terminals 4 made of Kovar. There are also a structure in which part of the frame 1 is made of a ceramic, which is an insulator, and is integrated with the ceramic terminal portions 3 and a structure in which the lead terminals 4 are inserted into through-holes provided in the frame 1 and are fixed to the frame 1 by glass sealing.

Furthermore,-the frame 1 has a light transmitting window 5 through which light is transmitted between the inside and the outside of the container. The light transmitting window 5 is normally made up of a pipe made of Kovar or the like, and a window material such as glass bonded for the purpose of hermetic sealing. Some types of hermetically sealed optical-semiconductor containers use an optical-fiber transmitting window which comprises an optical fiber inserted through the frame 1 and hermetically sealed by soldering without the use of a window material such as glass. In this case, only the pipe which constitutes a window frame is joined to the frame 1 of the container.

The components such as the frame 1, the bottom plate 2 and the lead terminals 4 are joined together by silver brazing or soldering, thus assembling a hermetically sealed optical-semiconductor container. The entire hermetically sealed optical-semiconductor container is normally plated with gold for the purpose of effecting hermetic sealing with a lid at a later time, for the purpose of preventing corrosion of the container, and for the purpose of facilitating soldering during the assembly of an optical-semiconductor module. After an optical-semiconductor element and the like have been mounted inside this hermetically sealed optical-semiconductor container, a lid (not shown) is finally fixed to the top end face of the frame 1 by welding or soft soldering via a ring made of Kovar or the like.

Such a hermetically sealed optical-semiconductor container is disclosed in, for example, Japanese Patent Laid-Open No. 314747/1994. As is described in Japanese Patent Laid-Open No. 314747/1994, the bottom plate made of Kovar or CuW is in general fabricated by cutting these metals. In particular, if the bottom plate is made of CuW, its coefficient of thermal expansion differs from that of Kovar of the frame, so that the container may warp. The warp leads to the problem that the optical axis of the optical-semiconductor module fixed to a heat sink by screws may deviate. Accordingly, in the above-cited Japanese Patent Laid-Open, a flange portion of the bottom plate is made thin by cutting so that the warp is reduced and absorbed.

In Japanese Patent Laid-Open No. 82659/1994, an equivalent effect is obtained by forming only the flange portion of the bottom out of a different metal having a small coefficient of longitudinal elasticity, instead of thinning the flange portion. However, it is extremely difficult to join different kinds of metals at joining portions having small areas and obtain a sufficient strength.

An optical-semiconductor module, as shown in FIG. 3, includes a circuit board 7 on which are mounted an optical-semiconductor element such as a laser diode (LD) element 6 or a photodiode (PD) element, a driver IC for driving the optical-semiconductor element, a chip thermistor for temperature measurement and the like, and the above-described type of hermetically sealed optical-semiconductor container in which the circuit board 7 is mounted. However, the LD element tends to vary in oscillation wavelength with temperature, and also has the disadvantage that its optical output lowers or its life becomes extremely short under high-temperature conditions, leading to a decrease in reliability.

For this reason, an electronic cooling device is used for controlling the temperature and cooling the LD element and the like. This electronic cooling device has a structure in which, as shown in FIG. 3, a plurality of electronic cooling elements (Peltier elements) 8 each of which is made of a crystal or a sintered body of BiTe which is a compound semiconductor are sandwiched between two insulator substrates 9 each of which comprises a ceramic plate and on which electrodes and interconnections are provided by metallization. Alumina or aluminum nitride is in general used for the insulator substrates 9 of the electronic cooling device. In particular, in cases which high heat dissipation capability is needed or reduce the power consumption of the electronic cooling device is reduced, aluminum nitride (AlN) having a good heat conductivity is used for the insulator substrates 9.

Each of the electronic cooling elements 8 has a characteristic degradation of the electronic cooling elements degrade the cooling efficiency of the electronic cooling device, increasing the power consumption thereof. In the worst case, it leads to the problem that the temperature control of the optical-semiconductor module is impossible owing to its self-heating.

This problem is caused by the fact that temperature variation causes warp of components such as the bottom plate of the hermetically sealed optical-semiconductor container and the circuit board on which the LD element or the PD element in the optical-semiconductor module are mounted, and thermal stress is concentrated in the electronic cooling elements such as BiTe elements which have a low Young's modulus and are comparatively soft, with the result that cracks occur in the electronic cooling elements.

It is considered that the warp (stress strain) of the bottom plate of the hermetically sealed optical-semiconductor container, which causes the above-described problems, occurs due to the following major reasons, i.e., (1) thermal stress strain of the bottom plate due to the difference in coefficient of thermal expansion between the frame of the container and the bottom plate, and (2) thermal stress strain of the bottom plate due to the difference in coefficient of thermal expansion between the bottom plate of the container and the insulator substrates of the electronic cooling device. It is also considered that there are other reasons; for example, (3) the bottom plate is warped due to thermal stress strain due to the difference in coefficient of thermal expansion between the insulator substrates of pair of leads which are electrically joined by the interconnection formed by metallization on the insulator substrates 9 for electrical connection with the hermetically sealed optical-semiconductor container. Incidentally, in the assembly of the optical-semiconductor module, after this electronic cooling device has been soldered to the bottom plate 2 of the hermetically sealed optical-semiconductor container, the circuit board 7 on which the optical-semiconductor element such as the LD element 6 or the PD element and other components are mounted is fixed to either one of the insulator substrates 9 of the electronic cooling device by soldering.

Incidentally, Japanese Patent Laid-Open No. 67844/1993 has proposed an optical-semiconductor module in which the bottom plate of a hermetically sealed optical-semiconductor container is used as the insulator substrate of an electronic cooling device, i.e., a method of forming the bottom plate of the hermetically sealed optical-semiconductor container out of a ceramic such as AlN. In this method, since one of the insulator substrates of the electronic cooling device can be omitted, it is possible to realize semiconductor modules having smaller sizes, particularly, thinner shapes.

After the hermetically sealed optical-semiconductor container which includes portions made of different kinds of materials in the above-described manner has been assembled into an optical-semiconductor module, if the optical-semiconductor module is subjected to an environment resistance test of −40° C. to +125° C. which is specified in MIL-STD, the characteristics of electronic cooling elements such as BiTe elements occasionally degrade. The the electronic cooling device and the circuit board, and (4) a heat sink to which the bottom plate is fixed is occasionally warped by the entire strain and the warp of the heat sink causes the bottom plate to warp.

Further, there is a case in which the warp of the bottom plate of the hermetically sealed optical-semiconductor container may not cause defects in the electronic cooling device but may deviate the optical axis of an optical system which provides optical coupling between an optical-semiconductor element such an LD element or a PD element and an optical fiber. This deviation of the optical axis leads to the problem of lowering the output at the optical fiber end of the optical-semiconductor module.

The method of forming the bottom plate of the hermetically sealed optical-semiconductor container from a ceramic such as AlN, as described in the above-cited Japanese Patent Laid-Open No. 67844/1993, has the-disadvantage that screwing hole portions or the like are difficult to form in the bottom plate and a portion which surround the screwing hole portions of the bottom plate is easily broken during screwing. In addition, the method has other problems; for example, even after the optical-semiconductor module and the heat sink have been screwed together, the bottom plate is easily broken when the heat sink warps.

SUMMARY OF THE INVENTION

In light of the above-described conventional problems, an object of the present invention is to provide a hermetically sealed optical-semiconductor container such that the warp of its bottom plate can be suppressed, and an optical-semiconductor module in which degradation of electronic cooling elements or deviation of an optical axis is prevented by the use of such a hermetically sealed optical-semiconductor container.

To achieve the above object, the present invention provides a hermetically sealed optical-semiconductor container in which an optical-semiconductor element is accommodated, which comprises a frame made of a metal, an insulating material or a composite material of a metal and an insulating material, a first bottom plate fixed to the frame and made of a metal, and a second bottom plate which is fixed to the opposite surface of the first bottom plate to the frame and has a larger Young's modulus than the first bottom plate, or a hermetically sealed optical-semiconductor container in which an optical-semiconductor element is accommodated, which comprises a frame made of a metal, an insulating material or a composite material of a metal and an insulating material, a first bottom plate fixed to the frame, and a second bottom plate which is fixed to the opposite surface of the first bottom plate to the frame and has a smaller Young's modulus than the first bottom plate.

In the hermetically sealed optical-semiconductor container according to the present invention, it is preferable that the Young's modulus of the bottom plate made of the metal be not greater than $15 \times 10^3$ kg/mm$^2$ and the Young's modulus of the bottom plate having the larger Young's modulus than the bottom plate made of the metal be not less than $25 \times 10^3$ kg/mm$^2$, within a temperature range of −40° C. to +250° C. for which the environmental test temperature of the MIL-STD and the soldering temperature during the manufacture of LD modules are considered.

In addition, in the hermetically sealed optical-semiconductor container according to the present invention, the frame, like an ordinary one, includes a lead terminal, a light transmitting window or an optical-fiber transmitting window, and a lid fixed to the opposite side of the frame to the bottom plate of the frame.

An optical-semiconductor module according to the present invention is the one in which at least one optical-semiconductor element mounted on a circuit board is accommodated in a hermetically sealed optical-semiconductor container. In this optical-semiconductor module, an electronic cooling device including Peltier elements sandwiched between a pair of insulator substrates can be disposed between the first bottom plate of the container and the circuit board.

DETAILED DESCRIPTION OF THE PREFERRED EMBODIMENTS

Figure 4:
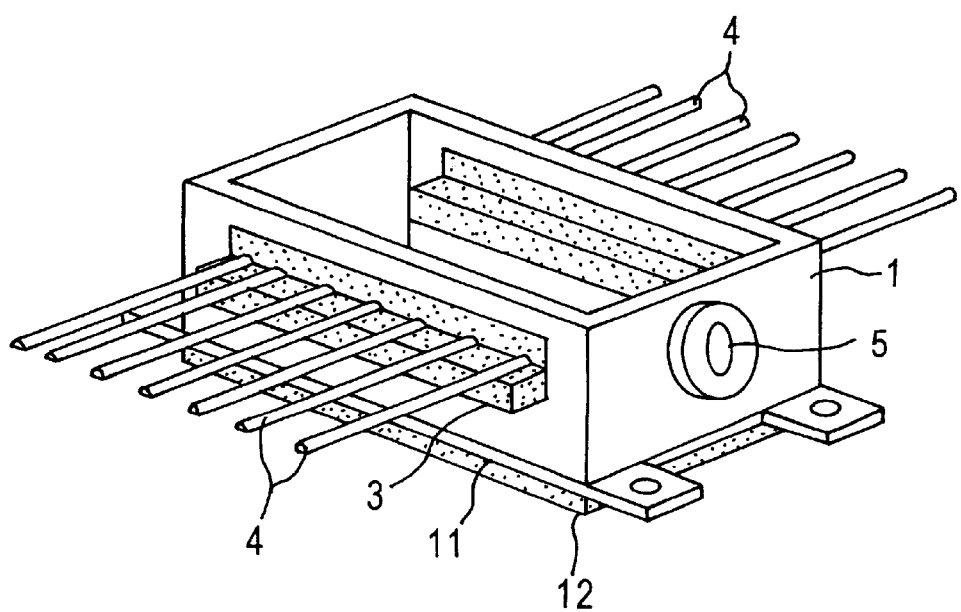
FIG. 4 is a schematic perspective view showing one specific example of a hermetically sealed optical-semiconductor container according to the present invention.
Figure 5:
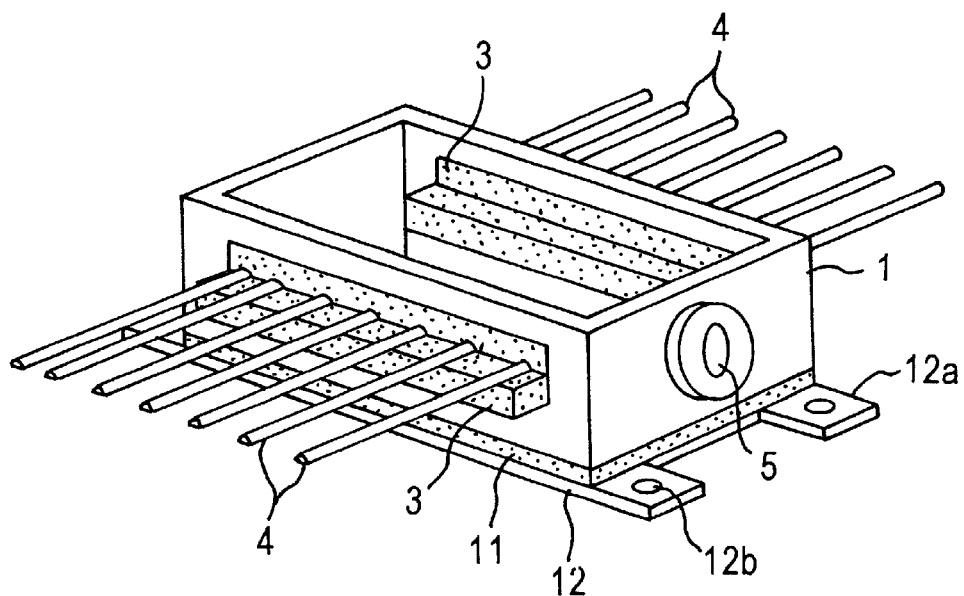
FIG. 5 is a schematic perspective view showing another specific example of a hermetically sealed optical-semiconductor container according to the present invention.

In the hermetically sealed optical-semiconductor container according to the present invention, as specifically shown in FIGS. 4 and 5, a bottom plate fixed to a frame 1 has a two-layer structure which includes a first bottom plate 11 fixed to the frame 1 and a second bottom plate 12 which is fixed to the opposite surface of the first bottom plate 11 to the frame 1. Since either the first or second bottom plate 11, 12 is made of a metal and is made smaller in Young's modulus than the other, stress: strain which is the main cause of warp of the bottom plate is absorbed by a soft bottom plate made of a metal and having a smaller Young's modulus, so that warp does not occur in the other bottom plate and its flatness is maintained. Accordingly, neither the degradation of electronic cooling elements due to temperature variation nor the deviation of the optical axis of an optical'system occurs if such a hermetically sealed optical-semiconductor container is used in an optical-semiconductor module.

In general, if the coefficient of thermal expansion of the bottom plate is larger than the coefficient of thermal expansion of the frame, a tension naturally works after brazing during the assembly of the hermetically sealed optical-semiconductor container. This is because the expansion of the bottom plate is larger than that of the frame at the brazing temperature as high as approximately 800° C. and if the bottom plate and the frame are cooled to normal temperature after the brazing material has been solidified, the degree of shrinkage of the bottom plate becomes relatively larger. This tension is a cause of the warp, but in the present invention in which the bottom plate includes the first bottom plate 11 and the second bottom plate 12 which is made of a soft thin metal having a smaller Young's modulus, or the bottom plate includes the second bottom plate 12 and the first bottom plate 11 which is made of a soft thin metal having a smaller Young's modulus, the bottom plate made of the metal having the smaller Young's modulus, even after cooling, does not warp and can form a flat surface like a drumhead. By fixing the bottom plate having the larger Young's modulus to the bottom plate made of metal, the flatness of the bottom plate having the larger Young's modulus is maintained even after the assembly of the container.

In such a manner, in order to cause the bottom plate made of metal to absorb stress strain so as to maintain the flatness of the other bottom plate, it is necessary that the Young's modulus of the bottom plate made of metal be smaller than that of the other bottom plate. Therefore, it is preferable that the Young's modulus of the bottom plate made of metal be not greater than $15 \times 10^3$ kg/mm$^2$ and the Young's modulus of the other bottom plate be not less than $25 \times 10^3$ kg/mm$^2$, within a temperature range of −40° C. to +250° C. for which the environmental test temperature of MIL-STD and the soldering temperature during the manufacture of LD modules are considered.

The material of the bottom plate which is larger in Young's modulus than the bottom plate made of metal can be a ceramic which contains not less than 90% aluminum nitride (AlN) or silicon carbide (SiC). When a ceramic whose Young's modulus is smaller than $25 \times 10^3$ kg/mm$^2$ is used, it is impossible to force the bottom plate made of metal to receive the stress strain, and the bottom plate in itself made of such a ceramic warps. In particular, AlN is suited to high output types because its heat conductivity is high compared to alumina. In addition, in order to prevent cracks or defects from occurring in the bottom plate having a larger Young's modulus, a ceramic having a bending strength of 25 kg/mm$^2$ or more is preferable.

Since the material of this bottom plate needs only to have a larger Young's modulus than the bottom plate made of metal, it is also possible to use any of various materials other than the aforesaid ceramic, for example, a metal such as tungsten or molybdenum, diamond, or a crystal or polycrystal of cubic BN. Although the thickness of the bottom plate is not limited to a particular value, the thickness is preferably approximately 0.3 to 1.0 mm.

The material of the bottom plate made of metal is preferably pure copper, an Fe—Ni—Co alloy such as Kovar, or an Fe—Ni alloy such as 24 alloy. However, a metal whose Young's modulus is larger than $15 \times 10^3$ kg/mm$^2$, for example, W or Mo, is not suited to the aforesaid bottom plate made of metal, because it is difficult to work a thin sheet of such a metal and such a metal cannot fully absorb strain. In addition, the coefficient of thermal expansion of the bottom plate made of metal is preferably in a range of 5 to 7 ppm/° C., so that the difference in coefficient of thermal expansion between the bottom plate made of metal and the frame or the like-can be decreased.

Furthermore, the thickness of the bottom plate made of metal is preferably 0.05 to 0.5 mm. The reason for this is that when the coefficient of thermal expansion of the frame and that of the bottom plate made of metal differ from each other, warp easily occurs in the container during brazing at a high temperature of approximately 800° C., but such warp can be effectively reduced by decreasing the thickness of the bottom plate made of metal to 0.5 mm or less. Contrarily, if the thickness of the bottom plate made of metal is less than 0.05 mm, breakage easily occurs in the bottom plate during screwing. For example, if pure copper is used for the bottom plate made of metal, the thickness of approximately 0.1 to 0.5 mm is effective, but for Kovar or 42 alloy, the thickness of approximately 0.05 to 0.2 mm is effective.

The first bottom plate and the second bottom plate are stacked one on top of the other and are fixedly bonded to each other by using a brazing material or the like. If Cu, an Fe—Ni—Co alloy or an Fe—Ni alloy is used for the bottom plate made of metal and a silver brazing material is used as the brazing material, the bottom plate made of metal and the silver brazing material may form an alloy which causes strain, but if the bottom plate made of metal is previously plated with Ni or NiB, such phenomenon can be avoided. Incidentally, the Fe—Ni—Co alloy or the Fe—Ni alloy is advantageous as the bottom plate made of metal because its coefficient of thermal expansion is close to that of the bottom plate made of a ceramic, and Cu, particularly, pure copper is advantageous in that although its coefficient of thermal expansion greatly differs from that of the other bottom plate, its Young's modulus is small.

In addition, it is preferable to plate the surface of the bottom plate having a larger Young's modulus with Ni or NiB so that the wettability with the brazing material can be improved. If the bottom plate is made of a ceramic or the like, a layer made of one kind or more selected from among W, Mo, Pt, Ti and the like is first formed as a metallization layer, and the obtained layer is plated with Ni or NiB. The plating thickness of Ni or NiB is preferably in a range of 1.5 to 3 $\mu$m.

When combining the first and second bottom plates, the respective shapes of the plates can be determined considering that the first and second bottom plates are screwed to a heat sink. Incidentally, screwing hole or notch portions are preferably formed in the bottom plate made of a metal which is easily workable. The bottom plate made of metal can be easily etched or punched, and can also be half-etched depending on the position. Incidentally, if a hollow portion is formed in the bottom plate made of metal by half-etching, the hollow portion can be used for positioning during the assembly of the frame depending on the structure, whereby the yield of the mounting process can be increased. If a hollow portion for positioning into which an electronic cooling device having electronic cooling elements mounted on an insulator substrate is to be fitted is formed in the central portion of the first bottom plate, the electronic cooling device can be readily positioned. Furthermore, even if the first bottom plate is made of a low-heat-conductivity metal such as Kovar or 42 alloy, the electronic cooling device is in direct contact with the heat sink, so that heat dissipation capability is improved.

Figure 6:
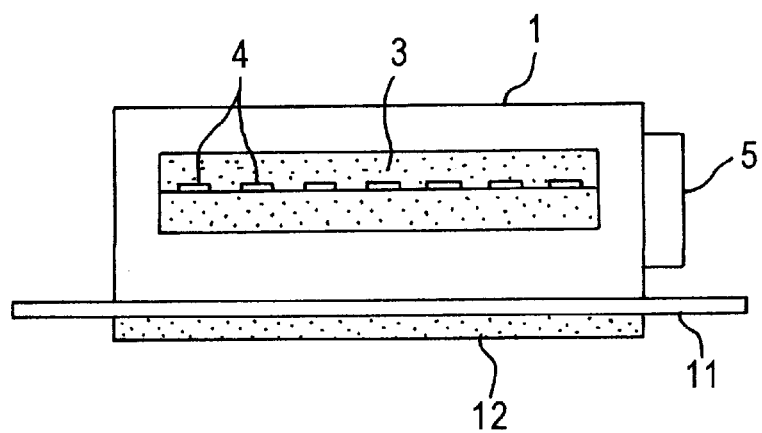
FIG. 6 is a schematic side view of the hermetically sealed optical-semiconductor container shown in FIG. 4.

As the simplest method for combining the first bottom plate and the second bottom plate in cases where the first bottom plate 11 is made of a metal which has a smaller Yong's modulus than the second bottom plate 12, there is a method of sandwiching the first bottom plate 11 having a flat shape between the second bottom plate 12 and the frame 1, as shown in FIG. 6. In this method it is easy to work the first bottom plate 11 made of metal, but since a step equivalent to the thickness of the second bottom plate 12 is present between the first bottom plate 11 and the heat sink on which the first bottom plate 11 is mounted, it is necessary to bend the first bottom plate 11 when the first bottom plate 11 is screwed to the heat sink. If the first bottom plate 11 made of metal is bent, there is a risk of occurrence of cracks in the second bottom plate 12 made of AlN or the like, the frame 1 or other components.

Figure 7:
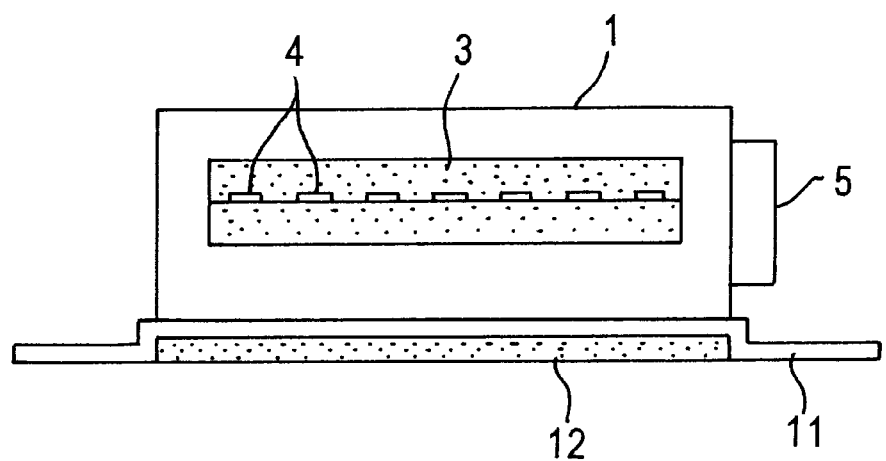
FIG. 7 is a schematic side view of a further specific example of the hermetically sealed optical-semiconductor container according to the present invention.

Consequently, one desirable method is to form a recess or hollow portion in the first bottom plate and insert the second bottom plate into the recess or hollow portion so that the opposite outer surfaces of both bottom plates to the frame which constitute a mounting surface for the heat sink is made flush with each other. For example, as shown in FIG. 7, there is a method of previously bending a central portion of the first bottom plate 11 made of metal into an inverted U-like cross-sectional shape, as by punching, and inserting the second bottom plate 12 into the obtained recess portion. Since the outer surfaces of the first bottom plate 11 and the second bottom plate 12 constitute a flat surface, this method is suitable for the mounting on the heat sink.

Figure 8:
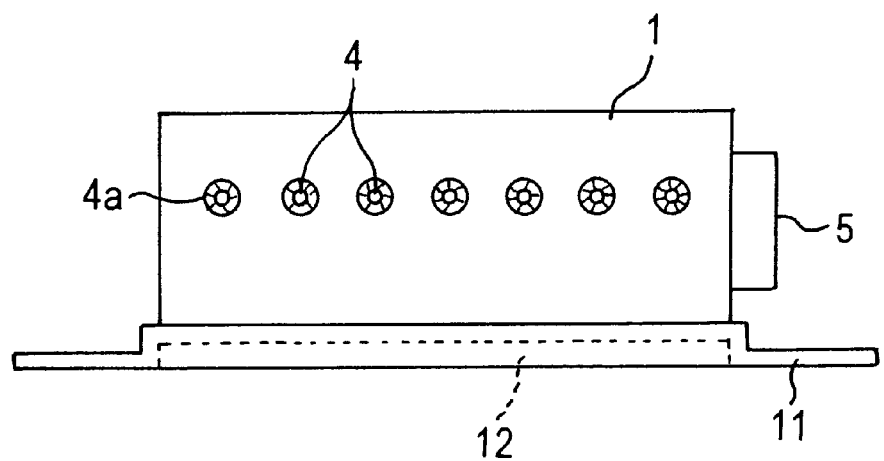
FIG. 8 is a schematic side view of yet another specific example of the hermetically sealed optical-semiconductor container according to the present invention.

Otherwise, as shown in FIG. 8, there is a method of forming a hollow portion into which the entire second bottom plate 12 is fitted, in a central portion of the first bottom plate 11. In this method, since the entire second bottom plate 12 is accommodated into the hollow portion, it is possible to protect even the second bottom plate 12 made of AlN susceptible to humidity, and it is also possible to easily improve the strength of a flange portion. Incidentally, in the example shown in FIG. 8, the lead terminals 4 are not attached by using the ceramic terminal portions 3 which are provided on the frame 1 as shown in FIGS. 6 and 7, but are fixed by glass seals 4a by passing the lead terminals 4 through through-holes formed in the frame 1.

Figure 9:
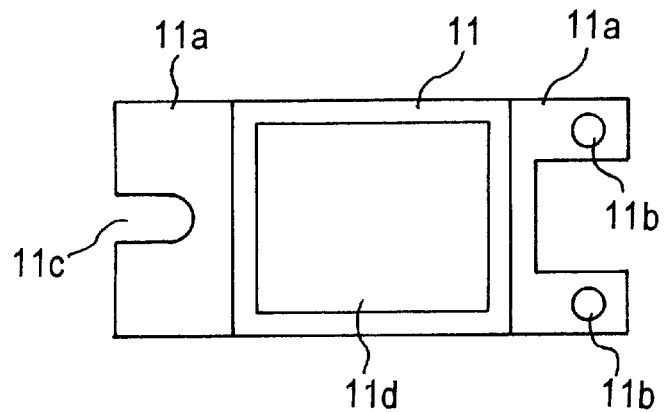
FIG. 9 is a front view of one specific example of the first bottom plate of an optical-semiconductor module according to the present invention.

A thin metal plate which constitutes the first bottom plate 11 can be easily worked, and flange portions 11a and screwing hole portions 11b or a notch portion 11c can also be easily worked by punching or etching, as shown in FIG. 9. In addition, since the thin metal plate does not need cutting, stress strain due to working can also be ignored. Furthermore, it is also possible to form a positioning hole portion 11d in which an electronic cooling device is installed, by hollowing a central portion of the first bottom plate 11, as by punching.

Meanwhile, a ceramic which constitutes the second bottom plate 12 is difficult to form into a complicated shape with high precision, but a ceramic plate, such as a ceramic flat plate of the type used herein or a ceramic plate which has a hollow portion in a portion where the electronic cooling device is mounted, can be fabricated readily at low cost by extrusion.

Figure 11:
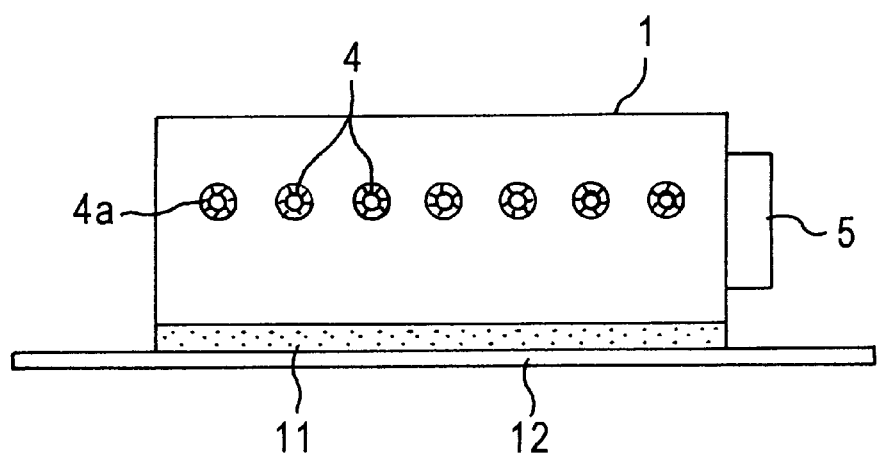
FIG. 11 is a schematic side view showing a further specific example of a hermetically sealed optical-semiconductor container according to the present invention.
Figure 12:
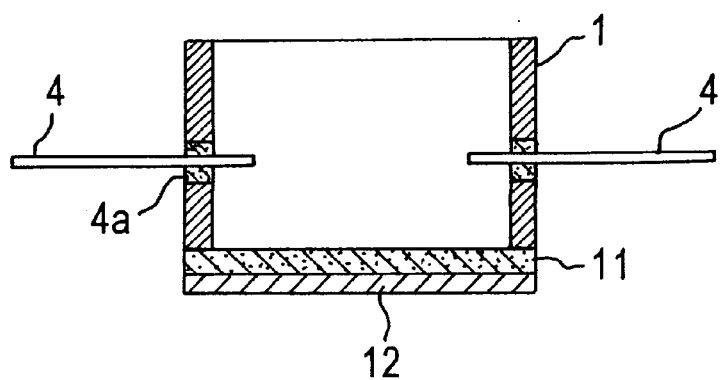
FIG. 12 is a schematic cross-sectional view of the hermetically sealed optical-semiconductor container shown in FIG. 11.

As the simplest specific method for combining the first bottom plate and the second bottom plate in cases where the second bottom plate 12 is made of a metal which is smaller in Young's modulus than the first bottom plate 11, there is a method of sandwiching the first bottom plate 11 having a flat shape between the second bottom plate 12 and the frame 1, as shown in FIGS. 11 and 12. This method can reduce costs because extra working need not be applied to the frame 1 or the like. Incidentally, in the example shown in FIGS. 11 and 12, the lead terminals 4 are not attached by using the ceramic terminal portions 3 which are provided on the frame 1 as shown in FIG. 5 but are respectively fixed by the glass seals 4a by passing the lead terminals 4 through through-holes formed in the frame 1.

Figure 13:
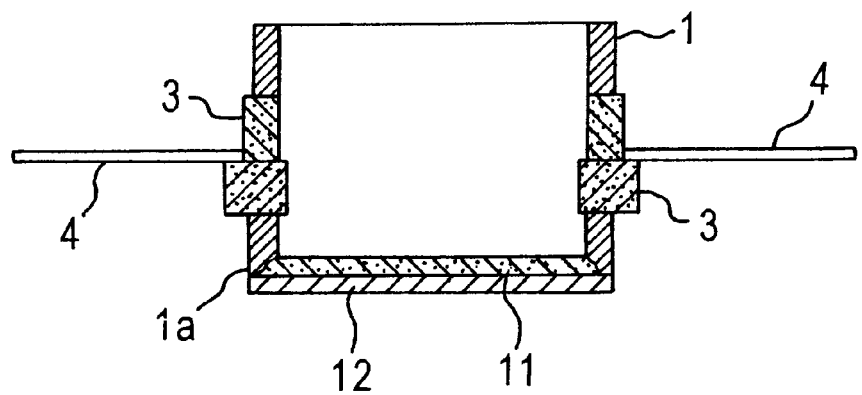
FIG. 13 is a schematic cross-sectional view of a further specific example of the hermetically sealed optical-semiconductor container according to the present invention.

Alternatively, as shown in FIG. 13, a step 1a may be formed at the lower end portion of the frame 1 so that the side end portion of the first bottom plate 11 can be fixedly fitted to the portion of the step 1a and the bottom end face of the frame 1 which has the step 1a can be fixed in contact with the second bottom plate 12. By this method, hermetical sealing can be more easily realized than by the above-described method shown in FIGS. 11 and 12, and further, the first bottom plate 11 made of an AlN ceramic susceptible to humidity can be protectively accommodated in the container.

Figure 14:
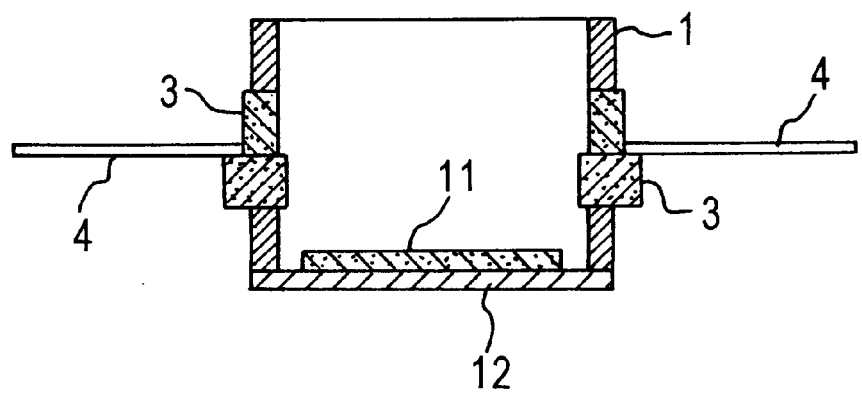
FIG. 14 is a schematic cross-sectional view of yet another specific example of the hermetically sealed optical-semiconductor container according to the present invention.

Furthermore, as shown in FIG. 14, the first bottom plate 11 which is smaller in size than the second bottom plate 12 may be placed on and fixed to the surface of a central portion of the second bottom plate 12, and the bottom end face of the frame 1 may be fixed to an exposed external marginal portion of the second bottom plate 12. In this case, if a metal having a larger coefficient of thermal expansion than the frame 1 is used for the second bottom plate 12, the influence of strain on the first bottom plate 11 can be completely eliminated, but there is the disadvantage that the optical axis easily deviates while an optical-semiconductor module is being screwed to the container.

A thin metal plate which constitutes the second bottom plate 12 can be easily worked, and flange portions 12a and screwing hole portions 12b or a notch portion or the like can also be easily worked by punching or etching, as shown in FIG. 5. In addition, since the thin metal plate does not need cutting, stress strain due to working can also be ignored. On the other hand, the ceramic which constitutes the first bottom plate 11 is difficult to form into a complicated shape with high precision, but a ceramic plate, such as a ceramic flat plate of the type used herein or a ceramic plate which has a positioning hollow portion in a portion where the electronic cooling device is mounted, can be fabricated readily at low cost by extrusion.

Figure 1:
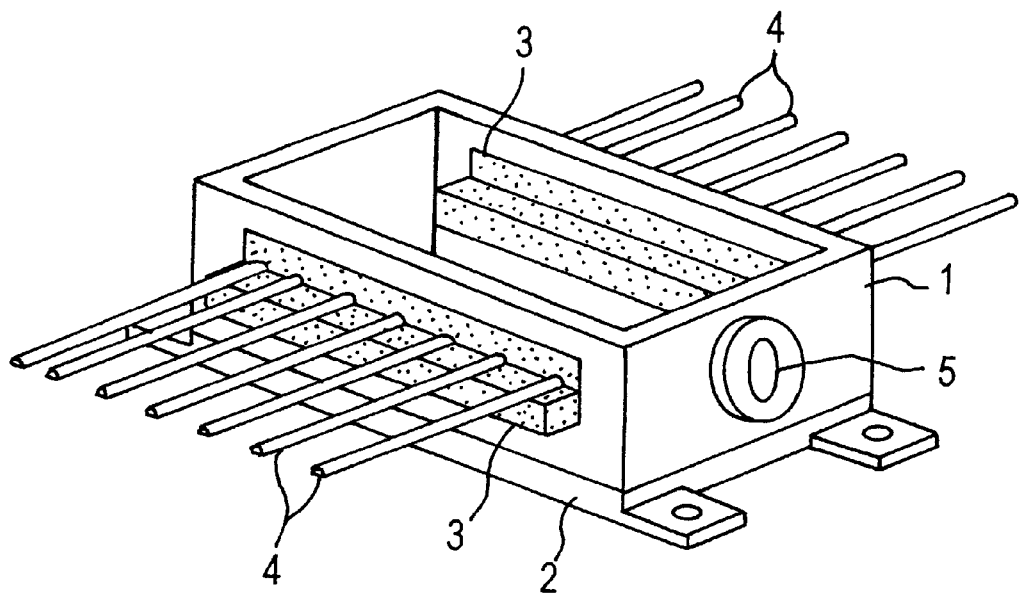
FIG. 1 is a schematic perspective view of a conventional hermetically sealed optical-semiconductor container.
Figure 2:
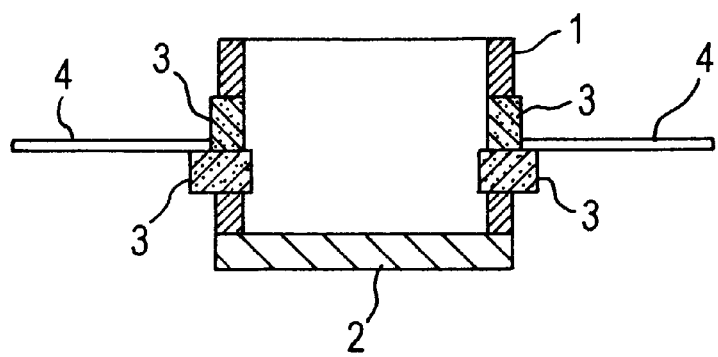
FIG. 2 is a schematic cross-sectional view of the conventional hermetically sealed optical-semiconductor container.
Figure 3:
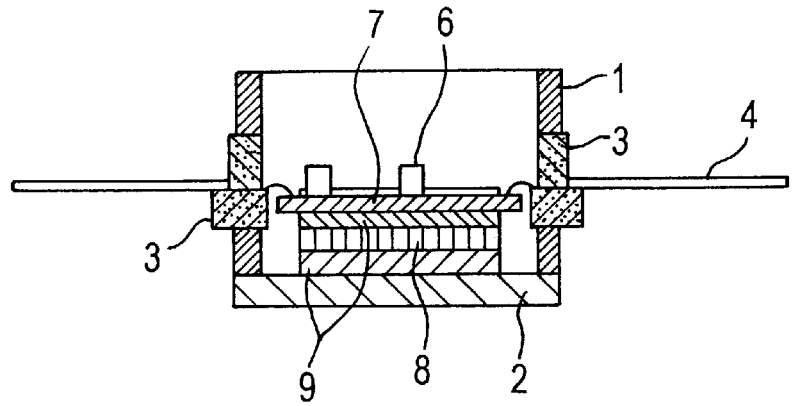
FIG. 3 is a schematic cross-sectional view of a conventional optical-semiconductor module.
Figure 15:
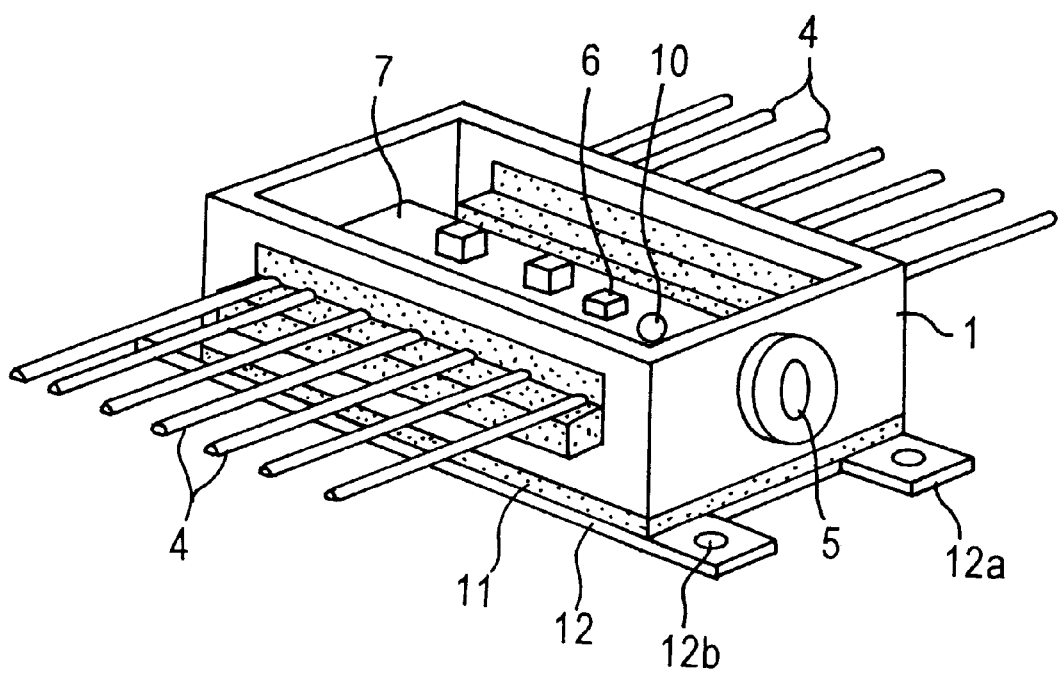
FIG. 15 is a schematic perspective view of another specific example of an optical-semiconductor module according to the present invention.

After the first bottom plate 11 and the second bottom plate 12 have been fixedly stacked in the above-described manner, the frame 1 is fixed to the first bottom plate 11 by brazing or the like, thus fabricating a hermetically sealed optical-semiconductor container as shown in FIG. 5. Incidentally, as the frame 1, as in conventional one a metal, an insulating material such as a ceramic, or a composite material of a metal and an insulating material can be used. An electronic cooling device is installed in this hermetically sealed optical-semiconductor container (refer to FIG. 3) in a manner similar to a conventional one, and after the circuit board 7 on which is mounted the LD element 6 or the like which is an optical-semiconductor element has been mounted on the electronic cooling device as shown in FIG. 15, the top opening of the frame 1 is hermetically sealed with a lid (not shown), thus producing an optical-semiconductor module.

In the construction of the above-described optical-semiconductor module, it is preferable that the difference in coefficient of thermal expansion between the circuit board on which the optical-semiconductor element is mounted, the insulator substrate of the electronic cooling device and the second bottom plate of the hermetically sealed optical-semiconductor container be made equal to or less than ±1 ppm/° C. Thus, it is possible to obtain an optical-semiconductor module in which no warp occurs even between the top and the bottom of the electronic cooling elements even when the temperature varies during a heat cycle environmental test of the MIL-STD in the range of −40° C. to +125° C., and in which the electronic cooling elements incorporated do not degrade, nor does the optical axis of the optical system deviate.

EXAMPLE 1

The hermetically sealed optical-semiconductor container shown in FIG. 4 was fabricated. A Kovar plate whose Young's modulus is not greater than $15 \times 10^3$ kg/mm$^2$ in an assembly temperature range of −40° C. to +250° C. for an ordinary semiconductor module was used for the frame 1 and the first bottom plate 11. The thickness of the first bottom plate 11 made of Kovar was 0.05 mm.

An AlN ceramic plate, which has a Young's modulus of $25 \times 10^3$ kg/mm$^2$ or more, a bending strength of 25 kg/mm$^2$ or more, a coefficient of thermal expansion of 4.5 ppm/° C. and a heat conductivity of 150 W/m·K and whose AlN content is 90% or more, was used for the second bottom plate 12. The thickness of the second bottom plate 12 made of this AlN ceramic plate was 1.0 mm.

The above-described Kovar plate was formed into an inverted U-like cross-sectional shape by punching, as shown in FIG. 7, and as shown in FIG. 9, the screwing hole portions 11b and the notch portion 11c were formed in the flange portions 11a and the hole portion 11d for positioning an electronic cooling device to be mounted at a later time was formed in the central portion of the first bottom plate 11. In the AlN ceramic plate, a hollow portion was formed in the surface of its central portion which corresponded to the positioning hole portion 11d of the first bottom plate 11.

Then, the first bottom plate 11 made of Kovar was subjected to Ni plating. In addition, after W/Ni metallization layers each having a thickness of 500 nm or less had been deposited by sputtering onto the second bottom plate 12 made of AlN ceramic, the W/Ni metallization layers were covered with Ni plating. After that, the second bottom plate 12 was inserted into the recess portion of the first bottom plate 11 and fixed to each other by silver brazing. Incidentally, other Ni-plated metallization layers such as W/Mo/Ni, W/Pt/Ni, Ti/Pt/Ni and Ti/Mo/Ni could be applied to the second bottom plate 12 without any problem.

The frame 1 made of Kovar was fixed by silver brazing, as shown in FIG. 4, to the first bottom plate 11 which was stacked and fixed as described above. In addition, the ceramic terminal portions 3 each constituted of a plurality of ceramic sheets, a plurality of lead terminals 4 made of Kovar, a ring for seam welding of Kovar, and a circular pipe frame made of Kovar, for the light transmitting window 5, were joined to the frame 1 by silver brazing. By joining these components at the same time, costs can be reduced, and heat dissipation characteristics are improved. After that, a glass plate for the light transmitting window 5 was bonded to the circular pipe frame and the entire body was plated with gold, thus finishing a hermetically sealed optical-semiconductor container.

Figure 10:
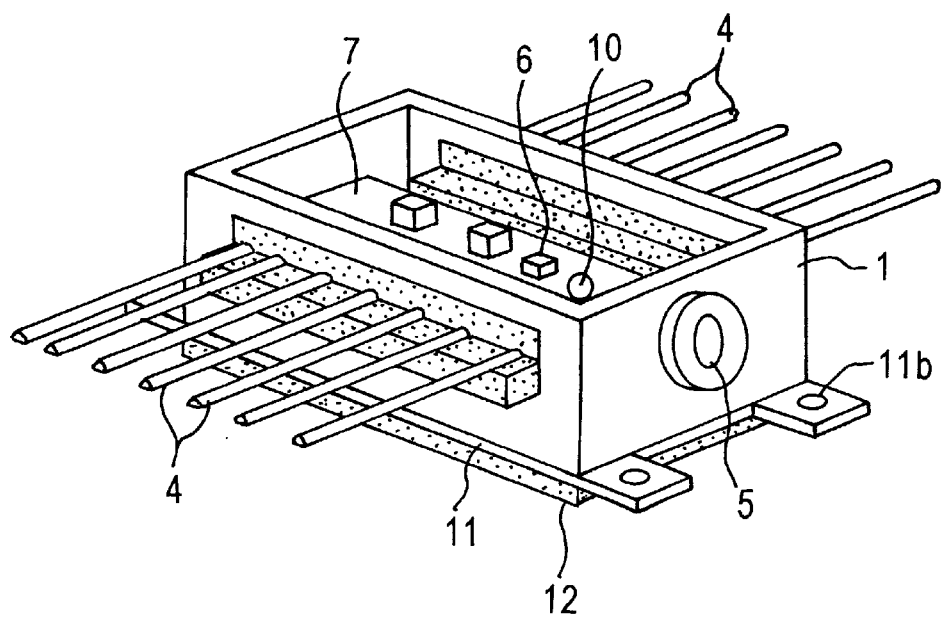
FIG. 10 is a schematic perspective view of one specific example of an optical-semiconductor module according to the present invention.

This hermetically sealed optical-semiconductor container was used to fabricate the optical-semiconductor module shown in FIG. 10. First, an electronic cooling device was mounted in an ordinary manner on the first bottom plate 11 of the hermetically sealed optical-semiconductor container. This electronic cooling device was of an ordinary type in which a plurality of BiTe elements serving as Peltier elements were sandwiched between two insulator substrates made of AlN. AlN ceramic identical to both that used for the second bottom plate 12 of the hermetically sealed optical-semiconductor container and that used for a circuit board which will be described later was used for the insulator substrates of the electronic cooling device.

An AlN ceramic substrate was used for the circuit board 7 incorporated in the optical-semiconductor module to be mounted. Such a circuit board may also be made of any insulating material other than AlN ceramic, for example, alumina, but an AlN ceramic identical to that used for the insulator substrates of the electronic cooling device was used because degradation of electronic cooling elements occurs if the difference in coefficient of thermal expansion between the circuit board and the insulator substrates of the electronic cooling device exceeds 1 ppm/° C. For this reason, the difference in coefficient of thermal expansion between the second bottom plate 12, the insulator substrates and the circuit board 7 was as small as approximately 0.1 ppm/° C. which is approximately equivalent to a tolerable measurement error of the coefficient of thermal expansion.

After the optical axes of the LD element 6 and a lens 10 had been aligned with each other, the LD element 6 and the lens 10 were fixed to the circuit board 7 made of AlN ceramic. Furthermore, circuit elements such as a PD element and a driver IC for modulating and driving the LD element 6 were mounted on the circuit board 7 behind the LD element 6. Incidentally, interconnection was formed by metallization on the circuit board 7 made of AlN ceramic so that degradation of high-frequency signals from the driver IC can be reduced and so that the life of the driver IC can be extended to improve the reliability. In addition a chip thermistor for temperature measurement was mounted in the vicinity of the LD element 6.

This circuit board 7 was soldered to one of the insulator substrates of the electronic cooling device. The wiring leads of the electronic cooling elements were connected by thermo-compression bonding to lead terminals prepared inside the hermetically sealed optical-semiconductor container. The other wiring was provided by ribbon-shaped wire bonding. Finally, a gold-plated Kovar lid (not shown) was seam-welded to the top opening of the frame 1 for the purpose of hermetic sealing.

An external optical fiber, after inserted into a zirconia ceramic ferrule, was obliquely polished at an angle of 8 degrees in order to reduce the influence of light reflection from the end face of the optical fiber upon the noise of the LD element 6. An external cylindrical sleeve made of an Fe—Ni alloy was secured to this ferrule, and an isolator and a lens onto which a cylindrical sleeve made of an Fe—Ni alloy was fixed were inserted between the optical fiber and the container. All these components were assembled by YAG welding after they had been mutually aligned so that a maximum amount of light could enter the optical fiber.

This optical-semiconductor module was fixed with screws to a heat sink of 3 mm thick×200 mm long×300 mm wide, by using the screwing hole portions 11*b* and the notch portion of the first bottom plate 11, and was then subjected to a heat cycle test in the temperature range of −40° C. to +125° C., but neither degradation of the electronic cooling elements nor a decrease in optical output due to out-of-alignment of the optical axis of the optical system was observed.

Although in the above-described example AlN ceramic was used for the second bottom plate, SiC ceramic whose SiC content is 90% or more may also be used. Such SiC ceramic has a high heat conductivity of 130 W/m·K and a coefficient of thermal expansion of 4.2 ppm/° C., and the difference in coefficient of thermal expansion between the SiC ceramic and the AlN ceramic which constitutes the insulator substrates of the electronic cooling device is as small as 0.3 ppm. In addition to these ceramics, W, Mo, diamond, cubic BN or the like can also be used for the second bottom plate.

For the first bottom plate 42 alloy or Cu may also be used. If Cu is used for the first bottom plate, it is desirable to give the first bottom plate a thickness of approximately 0.1 to 0.3 mm because Cu differs from the frame in coefficient of thermal expansion and has a small strength so that the screwing hole portions are easily broken. In the case of 42 alloy as well, it is desirable to give the first bottom plate a thickness of approximately 0.05 to 0.4 mm because 42 alloy is larger in coefficient of thermal expansion than Kovar of the frame. In the case of an optical-semiconductor module which does not use an electronic cooling device, a mounting circuit board is directly joined to the container. Incidentally, in an optical-semiconductor module having this structure to which the present invention is applied, deviation of the optical axis did not occur.

EXAMPLE 2

The hermetically sealed optical-semiconductor container shown in FIG. 5 was fabricated. Kovar was used for the frame 1, and pure copper whose Young's modulus is not greater than $15 \times 10^3$ kg/mm$^2$ in an assembly temperature range of −40° C. to +250° C. for an ordinary semiconductor module was used for the second bottom plate 12. The thickness of the second bottom plate 12 made of this pure copper was 0.5 mm.

AlN ceramic, which has a Young's modulus of $25 \times 10^3$ kg/mm$^2$ or more, a bending strength of 25 kg/mm$^2$ or more, a coefficient of thermal expansion of 4.5 ppm/° C. and a heat conductivity of 150 W/m·K and whose AlN content is 90% or more, was used for the first bottom plate 11. The thickness of the second bottom plate 12 made of this AlN ceramic was 1.0 mm.

The second bottom plate 12 made of the above-described pure copper was punched to form the flange portions 12*a*, the screwing hole-portions 12*b* and the like. A hollow portion for positioning an electronic cooling device was formed in the surface of a central portion of the first bottom plate 11 made of the above-described AlN ceramic.

Then, the second bottom plate 12 made of the pure copper was subjected to Ni plating. In addition, after W/Ni metallization layers each having a thickness of 500 nm or less had been formed by sputtering onto the first bottom plate 11 made of the AlN ceramic, the W/Ni metallization layers were covered with Ni plating. After that, the first bottom plate 11 and the second bottom plate 12 were stacked and fixed to each other by silver brazing. Incidentally, other Ni-plated metallization layers such as W/Mo/Ni, W/Pt/Ni, Ti/Pt/Ni and Ti/Mo/Ni could be applied to the first bottom plate 11 without any problem.

The frame 1 made of Kovar was fixed by silver brazing, as shown in FIG. 5, to the first bottom plate 11 which was stacked and fixed as described above. In addition, the ceramic terminal portions 3 each constituted of a plurality of ceramic sheets, a plurality of lead terminals 4 made of Kovar, a ring for seam welding of Kovar, and a circular pipe frame made of Kovar, for the light transmitting window 5, were joined to the frame 1 by silver brazing. By joining these components at the same time, costs can be reduced, and heat dissipation characteristics are improved. After that, glass for the light transmitting window 5 was bonded to the circular pipe frame and the entire body was plated with gold, thus finishing a hermetically sealed optical-semiconductor container.

This hermetically sealed optical-semiconductor container was used to fabricate the optical-semiconductor module shown in FIG. 15. First, an electronic cooling device was mounted in an ordinary manner on the first bottom plate 11 made of AlN ceramic of the hermetically sealed optical-semiconductor container. This electronic cooling device was of an ordinary type in which a plurality of BiTe elements serving as Peltier elements were sandwiched between two insulator substrates made of AlN. AlN ceramic identical to both that used for the first bottom plate 11 of the hermetically sealed optical-semiconductor container and that used for a circuit board which will be described later was used for the insulator substrates of the electronic cooling device.

An AlN ceramic substrate was used for the circuit board 7 incorporated in the optical-semiconductor module to be mounted. Such a circuit board may also be made of any insulating material other than AlN ceramic, for example, alumina, but AlN ceramic identical to that used for the insulator substrates of the electronic cooling device was used because degradation of electronic cooling elements occurs if the difference in coefficient of thermal expansion between the circuit board and the insulator substrates of the electronic cooling device exceeds 1 ppm/° C. For this reason, the difference in coefficient of thermal expansion between the first bottom plate 11, the insulator substrates and the circuit board 7 was as small as approximately 0.1 ppm/° C. which was almost equivalent to a tolerable measurement error of the coefficient of thermal expansion.

After the optical axes of the LD element 6 and the lens 10 had been mutually aligned, the LD element 6 and the lens 10 were fixed to the circuit board 7 made of AlN ceramic. Furthermore, circuit elements such as a PD element and a driver IC for modulating and driving the LD element 6 were mounted on the circuit board 7 behind the LD element 6. Incidentally, interconnection was formed by metallization on the circuit board 7 made of AlN ceramic so that degradation of high-frequency signals from the driver IC can be reduced and so that the life of the driver IC can be extended to improve the reliability. In addition, a chip thermistor for temperature measurement was mounted in the vicinity of the LD element 6.

This circuit board 7 was soldered to one of the insulator substrates of the electronic cooling device. The wiring leads of the electronic cooling elements were connected by thermo-compression bonding to lead terminals prepared inside the hermetically sealed optical-semiconductor container. The other wiring was provided by ribbon-shaped wire bonding. Finally, a gold-plated Kovar lid (not shown) was seam-welded to the top opening of the frame 1 for the purpose of hermetic sealing.

An external optical fiber, after inserted into a zirconia ceramic ferrule, was obliquely polished at an angle of 8 degrees in order to reduce the influence of light reflection from the end face of the optical fiber upon the noise of the LD element 6. An external cylindrical sleeve made of an Fe—Ni alloy was secured to this ferrule, and an isolator and a lens onto which a cylindrical sleeve made of an Fe—Ni alloy was fixed were inserted between the optical fiber and the container. All these components were assembled by YAG welding after they had been mutually aligned so that a maximum amount of light could enter the optical fiber.

This optical-semiconductor module was fixed with screws to a heat sink of 3 mm thick×200 mm wide×300 mm long, by using the screwing hole portions 12b and the notch portion of the second bottom plate 12, and was then subjected to a heat cycle test in the temperature range of −40° C. to +125° C., but neither degradation of the electronic cooling elements nor a decrease in optical output due to out-of-alignment of the optical axis of the optical system was observed.

Although in the above-described example AlN ceramic was used for the first bottom plate, SiC ceramic whose SiC content is 90% or more may also be used. Such SiC ceramic has a high heat conductivity of 130 W/m·K and a coefficient of thermal expansion of 4.2 ppm/° C., and the difference in coefficient of thermal expansion between the SiC ceramic and the AlN ceramic which constitutes the insulator substrates of the electronic cooling device is as small as 0.3 ppm. In addition to these ceramics, W, Mo, diamond, crystals or polycrystals of cubic BN or the like can also be used.

For the second bottom plate Kovar or 42 alloy may also be used. If Kovar is used for the second bottom plate, Kovar can also be used for the frame, but it is preferable to use 42 alloy or alumina ceramic having a larger coefficient of thermal expansion. If Kovar or 42 alloy is used for the second bottom plate, it is desirable to reduce its thickness to as small as 0.05 to 0.2 mm because the Young's modulus of either of Kovar and 42 alloy is larger than Cu. In the case of an optical-semiconductor module which does not use an electronic cooling device, a mounting circuit board is directly joined to the container. Incidentally, in an optical-semiconductor module having this structure to which the present invention is applied, deviation of the optical axis did not occur.

In accordance with the present invention, it is possible to provide a hermetically sealed optical-semiconductor container in which its bottom plate is free from warp so that neither a decrease in optical output due to deviation of the optical axis nor degradation of the electronic cooling element occurs, and to provide an optical-semiconductor module which uses such a container. In addition, the hermetically sealed optical-semiconductor container according to the present invention is superior in heat dissipation capability because the contact between the rear side of the container and the heat sink is high and the bottom plate can be made thin.

What is claimed is:

1. A hermetically sealed optical-semiconductor container in which an optical-semiconductor element is accommodated, comprising:
    a frame made of metal, an insulating material or a composite material of a metal and an insulating material,
    a first bottom plate fixed to said frame,
    and a second bottom plate fixed to opposite surface of said first bottom plate to said frame,
    wherein the second bottom plate is made of metal and has a smaller Young's modulus than the first bottom plate and wherein the first bottom plate has a Young's modulus of not less than $25 \times 10^3$ kg/mm$^2$ and the second bottom plate has a Young's modulus of not greater than $15 \times 10^3$ kg/mm$^2$.

2. A hermetically sealed optical-semiconductor container according to claim 1, wherein said second bottom plate has a hole portion or hollow portion through which said second bottom plate is screwed to a heat sink.

3. A hermetically sealed optical-semiconductor container according to claim 1, wherein said first bottom plate is sandwiched between a bottom end face of said frame and said second bottom plate.

4. A hermetically sealed optical-semiconductor container according to claim 1, wherein a hollow potion for positioning an electronic cooling device is formed in a central portion of said first bottom plate.

5. A hermetically sealed optical-semiconductor container according to claim 1, wherein said first bottom plate is made of a ceramic which contains not less than 90% aluminum nitride or silicon carbide and has a bending strength of not less than 25 kg/mm$^2$.

6. A hermetically sealed optical-semiconductor container according to claim 5, wherein said first bottom plate made of said ceramic has a surface covered with a metal layer of Ni or NiB.

7. A hermetically sealed optical-semiconductor container according to claim 1, wherein said second bottom plate made of said metal is made of pure copper, an Fe—Ni—Co alloy, or an Fe—Ni alloy.

8. A hermetically sealed optical-semiconductor container according to claim 7, wherein said second bottom plate made of said metal has a thickness of 0.05 to 0.5 mm.

9. A hermetically sealed optical-semiconductor container according to claim 7, wherein said second bottom plate has a surface layer covered with a metal layer of Ni or NiB.

10. A hermetically sealed optical-semiconductor container according to claim 1, wherein said frame includes a lead terminal, a light transmitting window or an optical-fiber transmitting window, and a lid fixed to the opposite side of said frame to the bottom plate of said frame.

11. An optical-semiconductor module wherein at least one optical-semiconductor element mounted on a circuit board is accommodated in a hermetically sealed optical-semiconductor container, said hermetically sealed optical-semiconductor container comprising a frame made of metal, an insulating material or a composite material of a metal and an insulating material, a first bottom plate fixed to said frame, and a second bottom plate fixed to opposite surface of said first bottom plate to said frame, wherein the second bottom plate is made of metal and has a smaller Young's modulus than the first bottom plate and wherein the first bottom plate has a Young's modulus of not less than $25 \times 10^3$ kg/mm$^2$ and the second bottom plate has a Young's modulus of not greater than $15 \times 10^3$ kg/mm$^2$.

12. An optical-semiconductor module according to claim 11, wherein an electronic cooling device including Peltier elements sandwiched between a pair of insulator substrates is disposed between a first bottom plate and the circuit board of said container.

13. An optical-semiconductor module wherein at least one optical-semiconductor element mounted on a circuit board is accommodated in a hermetically sealed optical-semiconductor container, said hermetically sealed optical-semiconductor container comprising a frame made of metal, an insulating material or a composite material of a metal and an insulating material, a first bottom plate fixed to said frame, and a second bottom plate fixed to opposite surface of said first bottom plate to said frame, said second bottom plate being made of metal and having a smaller Young's modulus than said first bottom plate, and an electronic cooling device including Peltier elements sandwiched between a pair of insulator substrates disposed between the first bottom plate and the circuit board of said container.

14. A hermetically sealed optical-semiconductor container in which an optical-semiconductor element is accommodated, comprising:

a frame made of metal, an insulating material or a composite material of a metal and an insulating material, a first bottom plate to said frame, wherein said first bottom plate fixed is made of a ceramic which contains not less than 90% aluminum nitride or silicon carbide and has a bending strength of not less than 25 kg/mm$^2$; and a second bottom plate fixed to opposite surface of said first bottom plate to said frame, wherein the second bottom plate is made of metal and has a smaller Young's modulus than the first bottom plate.

15. A hermetically sealed optical-semiconductor container according to claim 14, wherein said first bottom plate made of said ceramic has a surface covered with a metal layer of Ni or NiB.

16. A hermetically sealed optical-semiconductor container in which an optical-semiconductor element is accommodated, comprising:

a frame made of metal, an insulating material or a composite material of a metal and an insulating material, a first bottom plate fixed to said frame, a second bottom plate fixed to opposite surface of said first bottom plate to said frame, wherein the second bottom plate is made of metal and has a smaller Young's modulus than the first bottom plate and wherein said second bottom is made of pure copper, an Fe—Ni—Co alloy, or an Fe—Ni alloy.

17. A hermetically sealed optical-semiconductor container according to claim 16, wherein said second bottom plate made of said metal has a thickness of 0.05 to 0.5 mm.

18. A hermetically sealed optical-semiconductor container according to claim 16, wherein said second bottom plate has a surface layer covered with a metal layer of Ni or NiB.

* * * * *